United States Patent
Yang

(10) Patent No.: US 7,538,410 B2
(45) Date of Patent: *May 26, 2009

(54) FUSE STRUCTURE WINDOW

(75) Inventor: Wu-Der Yang, Taoyuan (TW)

(73) Assignee: Nanya Technology Corporation, Taoyuan (TW)

( * ) Notice: Subject to any disclaimer, the term of this patent is extended or adjusted under 35 U.S.C. 154(b) by 273 days.

This patent is subject to a terminal disclaimer.

(21) Appl. No.: 11/435,349

(22) Filed: May 15, 2006

(65) Prior Publication Data

US 2007/0023861 A1    Feb. 1, 2007

Related U.S. Application Data

(60) Continuation of application No. 10/750,696, filed on Jan. 2, 2004, now abandoned, which is a division of application No. 10/426,216, filed on Apr. 30, 2003, now Pat. No. 6,858,913.

(30) Foreign Application Priority Data

Jul. 19, 2002   (TW) ............................... 91116116 A

(51) Int. Cl.
    *H01L 29/00*    (2006.01)
(52) U.S. Cl. .................. 257/529; 257/530; 257/E23.15
(58) Field of Classification Search ................ 257/529, 257/665, 910, 530, E23.15
    See application file for complete search history.

(56) References Cited

U.S. PATENT DOCUMENTS

| 6,054,339 | A | * | 4/2000 | Gilmour et al. | ............ | 438/132 |
| 6,100,118 | A | | 8/2000 | Shih et al. | ................ | 438/132 |
| 6,121,073 | A | | 9/2000 | Huang et al. | ............... | 438/281 |
| 6,162,686 | A | | 12/2000 | Huang et al. | ............... | 438/281 |
| 6,225,652 | B1 | * | 5/2001 | Devanney | .................. | 257/209 |
| 6,288,436 | B1 | | 9/2001 | Narayan et al. | ............ | 257/529 |
| 6,573,125 | B2 | | 6/2003 | Bae | ........................... | 438/132 |
| 6,649,997 | B2 | * | 11/2003 | Koike | ........................ | 257/529 |
| 6,750,753 | B2 | * | 6/2004 | Yang | ......................... | 337/297 |
| 6,858,913 | B2 | * | 2/2005 | Yang | ......................... | 257/529 |
| 2003/0085445 | A1 | * | 5/2003 | Watanabe | .................. | 257/529 |
| 2003/0132503 | A1 | * | 7/2003 | Yang | ......................... | 257/529 |

* cited by examiner

*Primary Examiner*—Shouxiang Hu
(74) *Attorney, Agent, or Firm*—Ladas & Parry LLP

(57) ABSTRACT

The present invention provides a fuse structure. The fuse structure comprises a substrate, a plurality of conductive layers, a plurality of dielectric layers and a plurality of conductive plugs. The novel fuse structure includes a plurality of fuse units, and a new layout of the fuse units to increase the pitch between the fuse units, preventing the fuse structure from failing when misalignment of the laser beam and thermal scattering of the laser beam damage the second layer of the fuse structure in the laser blow process, thus increasing reliability and yield.

11 Claims, 8 Drawing Sheets

FUSE STRUCTURE WINDOW

CROSS-REFERENCE TO RELATED APPLICATIONS

This patent application is a continuation application of U.S. Ser. No. 10/750,696, filed on Jan. 2, 2004 now abandoned, which is a divisional application of U.S. Ser. No. 10/426,216, filed on Apr. 30, 2003, now U.S. Pat. No. 6,858,913, which claims priority to Taiwanese Application No. 91116116, filed Jul. 19, 2002.

BACKGROUND OF THE INVENTION

1. Field of the Invention

The present invention relates to a fuse structure and in particular a fuse structure that avoids damage from the laser blow process in its laser spot.

2. Description of the Related Art

Fuses are routinely used in the design of monolithic integrated circuits (IC), and particular in memory devices as elements for altering the configuration of the circuitry contained therein. As such, memories are commonly built with programmed capabilities wherein fuses are selectively "blown" by a laser beam.

It is well known that random access memories (RAM) are designed with redundancies which include spare columns, rows, or even fully functional arrays, such that when any element fails, the defective row, column and the like are replaced by a corresponding element. Disabling and enabling of spare elements are accomplished by fuses which are blown when required, preferably, by a laser beam.

Additionally, the technique of laser fuse deleting (trimming) has been widely used in both memory and logic IC fabrication industries, as an effective way to improve functional yields and to reduce development cycle time. Yet, fuse blow yield and fuse reliability are problematic in most conventional fuse designs.

FIG. 1 is a sectional view of a traditional fuse structure, FIG. 2 is a top view of a traditional fuse structure, and FIG. 1 shows a cross section C-C' of FIG. 2.

Referring to FIG. 1, symbol 100 shows a substrate having a laser spot 110. A metal layer M0 is formed on part of the substrate 100. A metal layer M1 is formed on part of the oxide layer, between the metal layer M0 and metal layer M1 having a oxide layer 120. A conductive plug 130 to penetrate the oxide layer 120 electrically connected the metal M0 layer and M1 layer. A laser spot 110 on part of the metal M1 layer and the top of a part of the oxide layer 120 forms a fuse window 140. The symbol 150 is a passivation layer.

FIG. 2 is a top view of FIG. 1, showing a plurality of fuse structures 210, 220, 230, 240 in fuse window 140. Each fuse structure comprises an M0 layer, conductive plug 130 and M1 layer. The solid line area shows the M1 layer, the dashed line area shows M0 layer, and each fuse structure comprises its own optimal laser spot 11. To give an example, a laser beam 290 blows the position 110 of the fuse structure 220. Because of misalignment of the laser beam 290 or thermal scattering of the laser beam 290, thermal shock from the laser blow process can damage the M0 layer. This can cause cracking, seriously affecting device reliability, and yield.

SUMMARY OF THE INVENTION

Accordingly, the invention provides a fuse structure comprising a substrate, a plurality of conductive layers, a dielectric layer, and a plurality of conductive plugs in a new arrangement, increasing the distance between different fuse units.

The invention also provides a fuse window having a plurality of fuse structures, each comprising a substrate, a plurality of conductive layers, a plurality of dielectric layers, and a plurality of conductive plugs. The fuse units are not electrically connected to each other.

A detailed description is given in the following embodiments with reference to the accompanying drawings.

The third object of the invention is to provide a processing method for the fuse structure.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
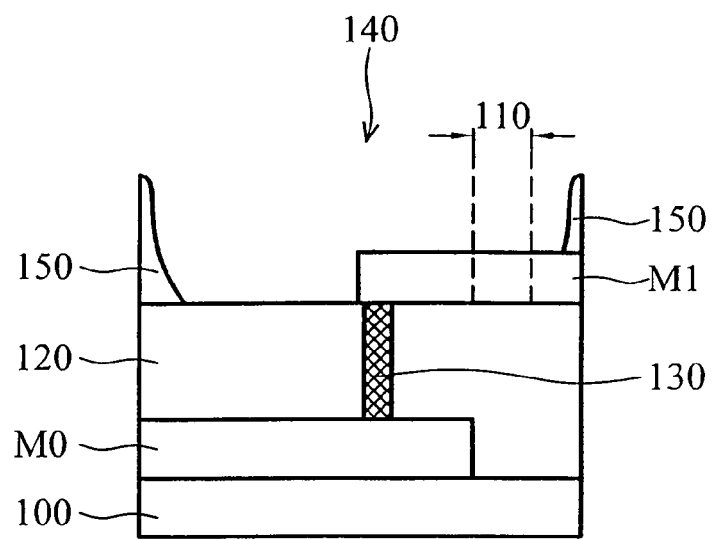
FIG. 1 is a sectional view of a traditional fuse structure.
Figure 2:
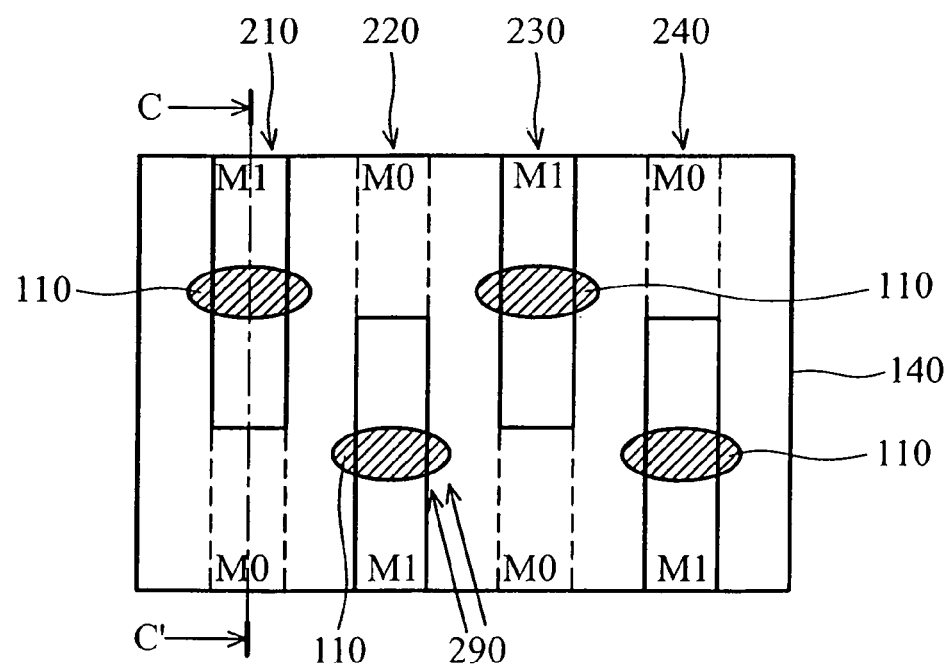
FIG. 2 is a sectional view of a traditional fuse structure, and shows a top view of FIG. 1.
Figure 3A:
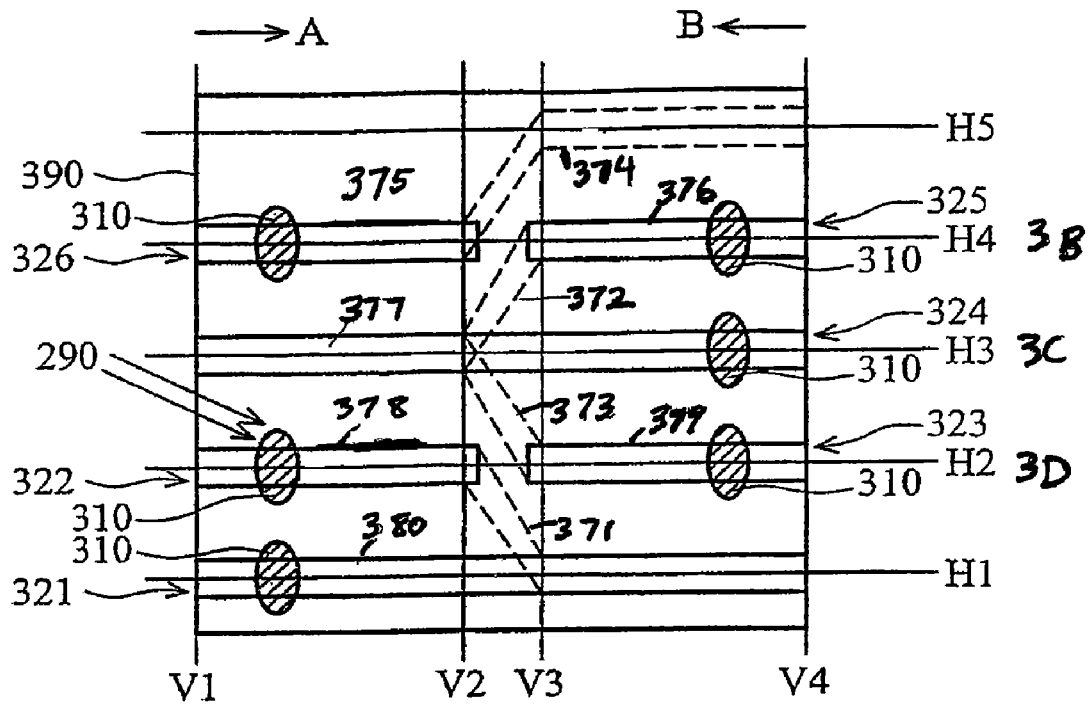
FIGS. 3A, 3F, and 4A are top views of the fuse structure of the present invention.
Figure 3B:
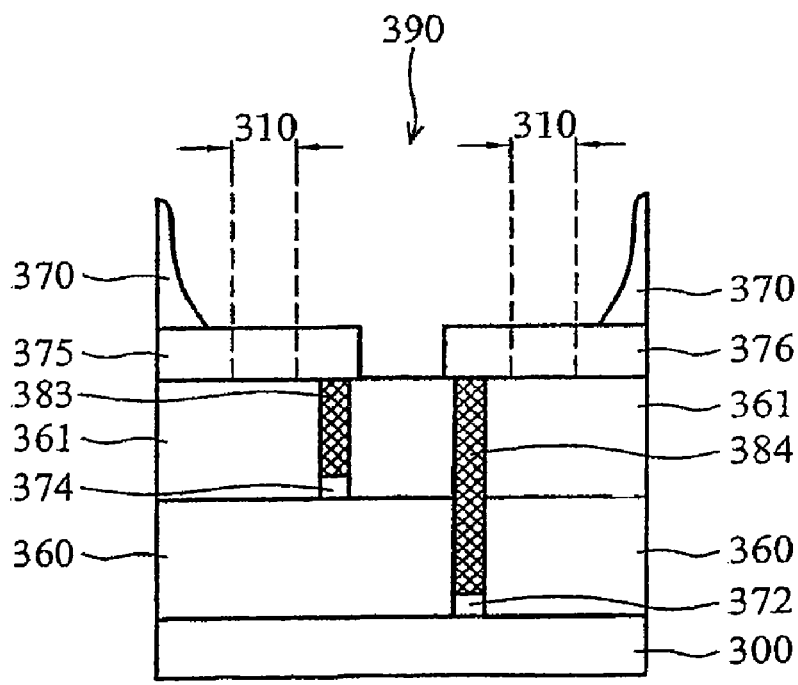
FIGS. 3B, 3C, and 3D are sectional views of FIG. 3A.
Figure 3C:
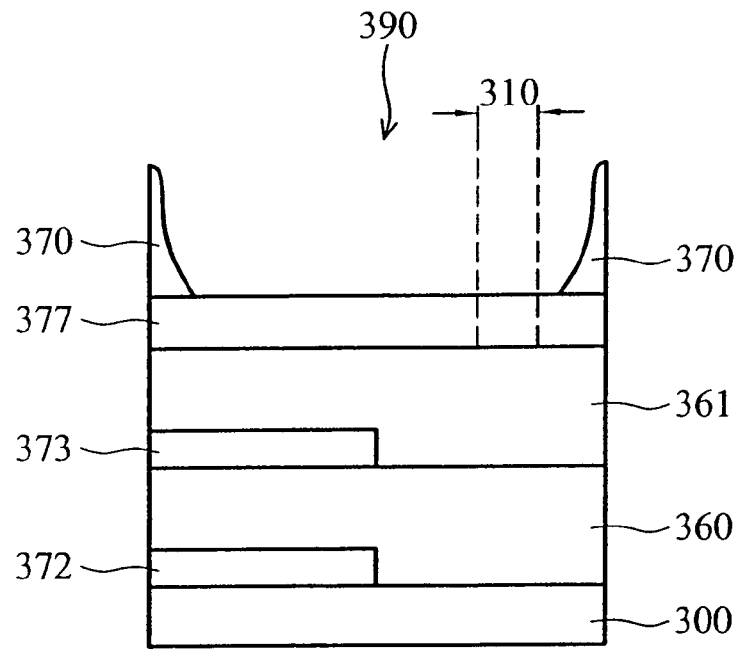
Figure 3D:
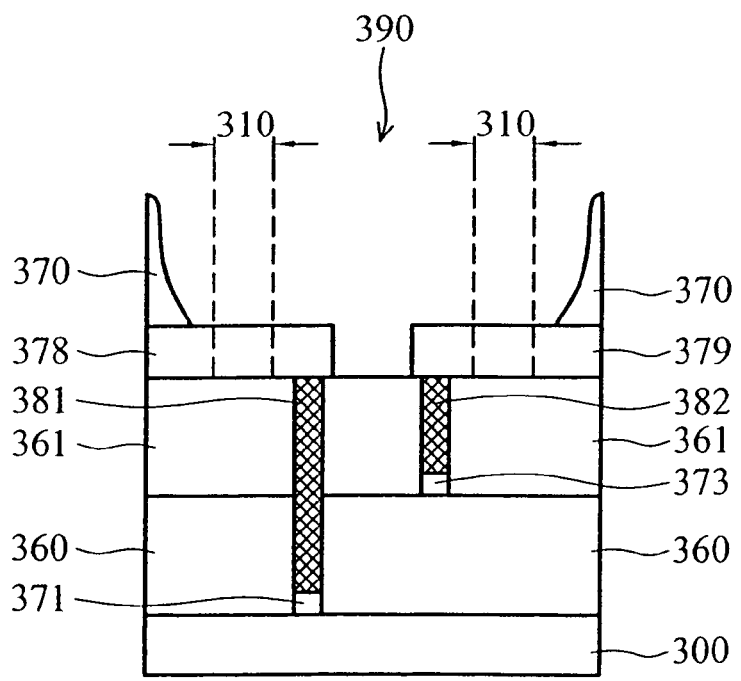
Figure 3E:
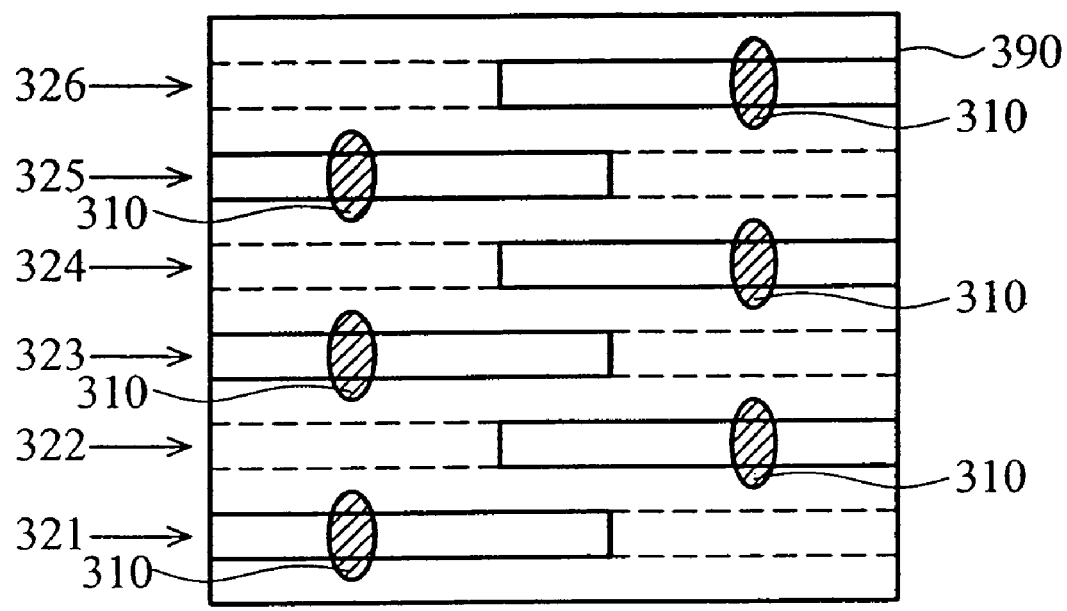
FIGS. 3E and 4E are top views of a traditional fuse structure.

A fuse structure of the first embodiment is shown in FIG. 3A, FIG. 3B, FIG. 3C, and FIG. 3D. FIG. 3A is a top view of the fuse structure of the present invention. FIGS. 3B, 3C, and 3D are sectional views of FIG. 3A. FIG. 3B is a cross section of the fourth horizontal line H4 of FIG. 3A. FIG. 3C is a cross section of the third horizontal line H3 of FIG. 3A. FIG. 3D is a cross section of the second horizontal line H2 of FIG. 3A.

In the first embodiment, the first horizontal line H1, the second horizontal line H2, the third horizontal line H3, the fourth horizontal line H4 and the fifth horizontal line H5 are arranged in order. The first vertical line V1, the second vertical line V2, the third vertical line V3, the fourth vertical line V4 are arranged in order. The second vertical line V2 is close to the third vertical line V3, to increase the distance between the first vertical line V1 and the second vertical line V2, and the distance between the third vertical line V3 and the fourth vertical line V4.

FIG. 3B shows a substrate 300. In FIG. 3A, a first conductive layer 371 (dotted line) is formed on part of the substrate 300. The first conductive layer 371 starts from a fourth vertical line V4 along a first horizontal line H1 in a second direction B, turning in an intersection of a second vertical line V2 and a second horizontal line H2. A second conductive layer 372 (dotted line) is formed on part of the substrate 300. The second conductive layer starts from a first vertical line V1 along a third horizontal line H3 in a first direction A, turning in an intersection of a third vertical line V3 and a fourth horizontal line H4. The first conductive layer 371 and the second conductive layer 372 are tungsten or polysilicon. In FIG. 3B, a dielectric layer 360 is formed on the first conductive layer 371, the second conductive layer 372, and the substrate 300. The first dielectric layer 360 is SiO$_2$. In FIG. 3D a plurality of openings are formed on the first dielectric layer 360 to expose the first conductive layer 371 and near a laser spot 310 side of the second conductive layer 372, to put into a first conductive plug 381 and a fourth conductive plug 384. The first conductive plug 381 and the fourth conductive plug 384 are tungsten or polysilicon.

FIG. 3A shows a third conductive layer 373. The third conductive layer 373 (dotted line) is formed on part of the first dielectric layer 360, wherein a layout of the third conductive layer 373 starts from the first vertical line V1 along the third horizontal line H3 in the first direction A, turning in an intersection of the third vertical line V3 and the second horizontal line H2. A fourth conductive layer 374 (dotted line) is formed on part of the dielectric layer 360. The fourth conductive layer 374 starts from the fourth vertical line V4 along a fifth horizontal line H5 in the second direction B, turning in an intersection of the second vertical line V2 and the fourth horizontal line H4. The third conductive layer 373 and the fourth conductive layer 374 are tungsten or polysilicon. FIG. 3B shows sectional views of FIG. 3A. The first dielectric layer 360, the third conductive layer 373 and the fourth conductive layer 374 are formed on a second dielectric layer 361. The second dielectric layer is $SiO_2$. In FIG. 3D a plurality of openings are formed on the second dielectric layer 361 to expose the first conductive plug 381, the fourth conductive plug 384, the third conductive layer 373 and near the laser spot 310 side of the fourth conductive layer 374, into the first conductive plug 381, the second conductive plug 382, the third conductive plug 383 and the fourth conductive plug 384. The first conductive plug 381, the second conductive plug 382, the third conductive plug 383, and the fourth conductive plug 384 are tungsten or polysilicon.

In FIG. 3A a fifth conductive layer 375, a sixth conductive layer 376, a seventh conductive layer 377, a eighth conductive layer 378, a ninth conductive layer 379 and a tenth conductive layer 380 are formed on part of the second dielectric layer 361. The fifth conductive layer 375 starts from the first vertical line V1 along the fourth horizontal line H4 in the first direction A, and extend to the second vertical line V2. The sixth conductive layer 376 starts from the fourth vertical line V4 along the fourth horizontal line H4 in the second direction B and extends to the third vertical line V3. The seventh conductive layer 377 starts from the first vertical line V1 along the third horizontal line H3 and extends to the fourth vertical line V4. The eight conductive layer 378 starts from the first vertical line V1 along the second horizontal line H2 in the first direction A and extends to the second vertical line V2. The ninth conductive layer 379 starts from the fourth vertical line V4 along the second horizontal line H2 in the second direction B and extends to the third vertical line V3. The tenth conductive layer 380 starts from the first vertical line V1 along the first horizontal line H1 and extends to the fourth vertical line V4. The fifth conductive layer 375, the sixth conductive layer 376, the seventh conductive layer 377, the eighth conductive layer 378, the ninth conductive layer 379, and the tenth conductive layer 380 are tungsten or polysilicon. The first conductive layer 371 is electrically connected to the first conductive plug 381 and the eighth conductive layer 378 is a fuse unit. The third conductive layer 373 is electrically connected to the second conductive plug 382 and the ninth conductive layer 379 is a fuse unit. The fourth conductive layer 374 is electrically connected to the third conductive plug 383 and the fifth conductive layer 375 is a fuse unit. The second conductive layer 372 is electrically connected to the fourth conductive plug 384 and the sixth conductive layer 376 is a fuse unit. The seventh conductive layer 377 is a fuse unit. The tenth conductive layer 380 is a fuse unit. The passivation layer is PE-TEOS $SiO_2$ or $Si_3N_4$.

FIG. 3A shows a fuse window 390, with a plurality of fuse structures (FIG. 3A only shows one fuse structure). Each fuse structure comprises fuse unit 321, fuse unit 322, fuse unit 323, fuse unit 324, fuse unit 325 and fuse unit 326, each with its own laser spot 310. The fuse unit 321, 322, 323, 324, 325 and 326 are not electrically connected to each other. A first laser spot is formed on the fifth conductive layer 375 of the fourth horizontal line. A second laser spot is formed on the sixth conductive layer 376 of the fourth horizontal line. A third laser spot is formed on the seventh conductive layer 377. A fourth laser spot is formed on the eighth conductive layer 378 of the second horizontal line. The fifth laser spot is formed on the ninth conductive layer 379 of the second horizontal line. A sixth laser spot is formed on the tenth conductive layer 380.

In FIG. 3A, FIG. 3B, FIG. 3C, and FIG. 3F, laser beam 290 blows the laser spot 310 in the eighth conductive layer 378 of the fuse unit 322. Misalignment of the laser beam 290 or thermal shock from the laser blow process can damage part of the third conductive layer 373 of fuse unit 323. FIG. 3L shows a traditional fuse structure in the same fuse area comprising six fuse units. The distance between fuse units of the first embodiment is more than in the prior art, thus receiving less damage from the laser blow process. In the first embodiment of the present invention the distance between the fourth laser spot 310 and adjacent to the fuse unit 322 of the third conductive layer 373 is 1.5 times that of the prior art.

Figure 3F:
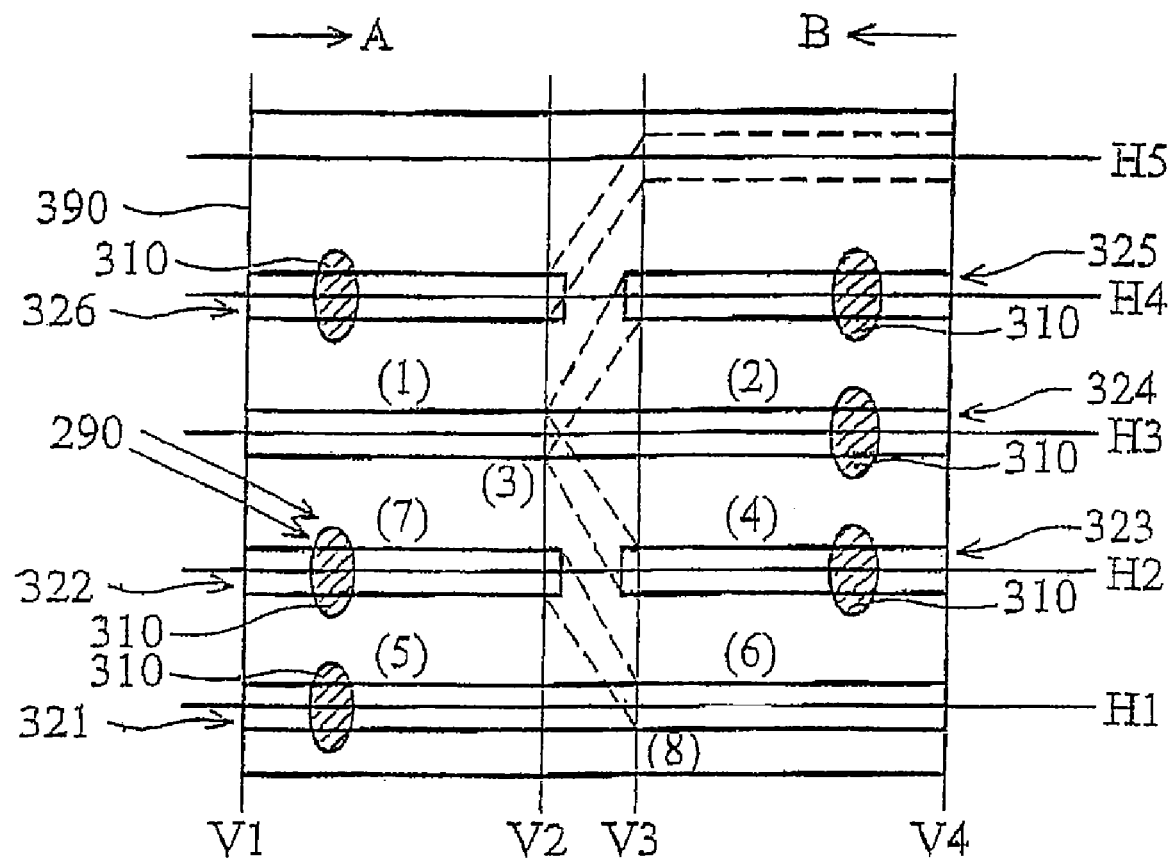

Specifically, as shown in FIG. 3F, the fuse unit 324 comprises a first portion 1 and a second portion 2 coplanar therewith. The fuse unit 323 comprises a third portion 3 and a fourth portion 4 non-coplanar therewith, and the third portion 3 overlaps the first portion 1 and connects the fourth portion 4 through the second conductive plug 382. The third fuse unit 321 comprises a fifth portion 5 and a sixth portion 6 coplanar therewith. The fourth fuse unit 322 comprises a seventh portion 7 and an eighth portion 8 non-coplanar therewith, and the eighth portion 8 overlaps the sixth portion 6 and connection the seventh portion 7 through the first conductive plug 381. Moreover, the fourth portion 4 and the seventh portion 7 are arranged between the first fuse unit 324 and the third fuse unit 321. Preferably, the fourth portion 4 is aligned with the seventh portion 7; the first portion 1 is aligned with the second portion 2; the fifth portion 5 is aligned with the sixth portion 6; each of the second, fourth, fifth and seventh portion 2, 4, 5 includes a laser spot therein, respectively. Additionally, the first second and third portions 1, 2, 3 are arranged in a first line; the fourth and seventh portions 4, 7 are arranged in a second line next to the first line; the fifth, sixth and eighth portions 5, 6, 8 are arranged in a third line next to the second line. According to the arrangement of this embodiment, the area occupied by the fuse units (for example, based on four fuse units) is less than that in the related art. As a result, more fuse units can be disposed in a single fuse structure.

Figure 4A:
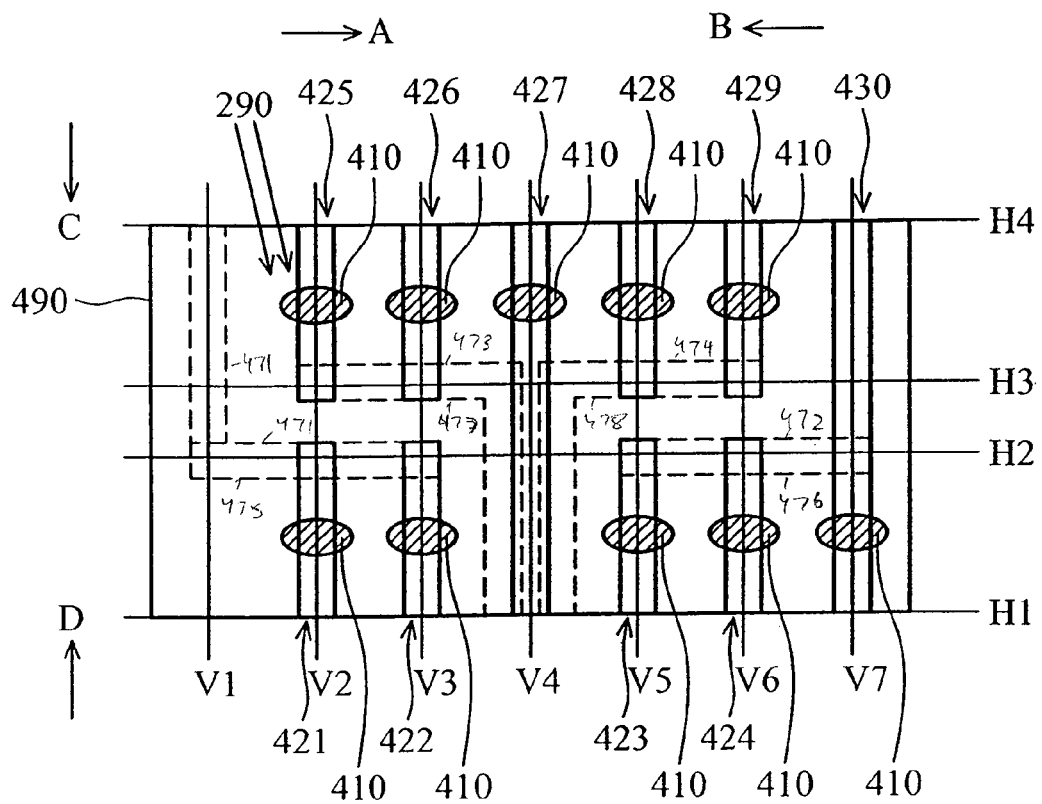
Figure 4B:
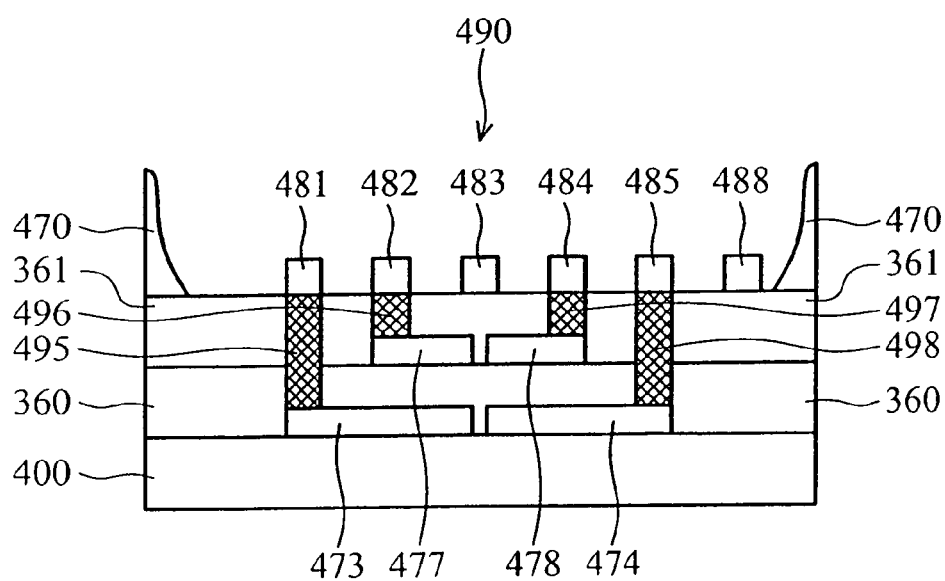
FIGS. 4B, 4C, and 4D are sectional views of FIG. 4A.
Figure 4C:
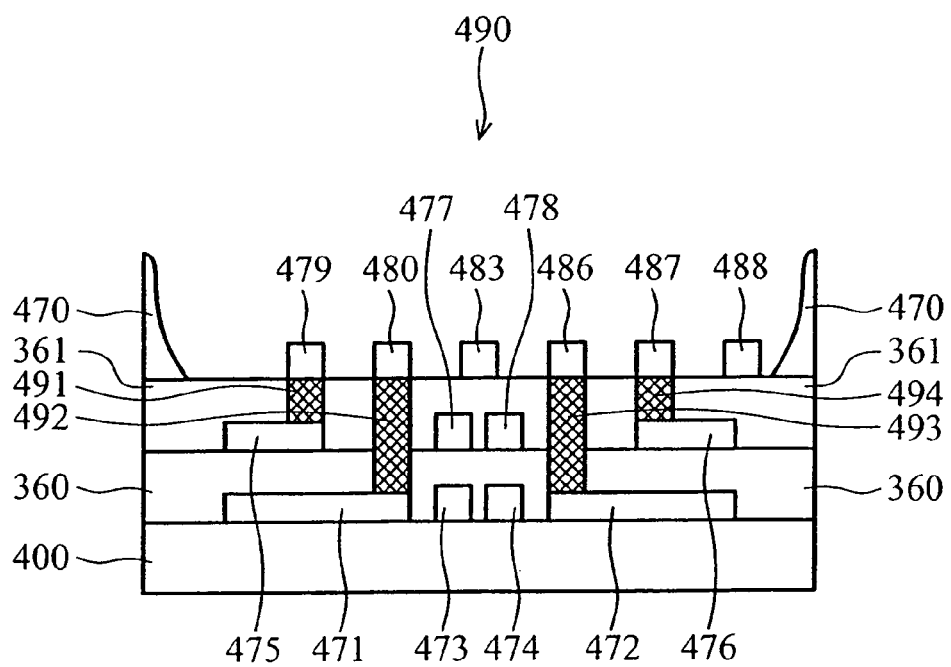
Figure 4D:
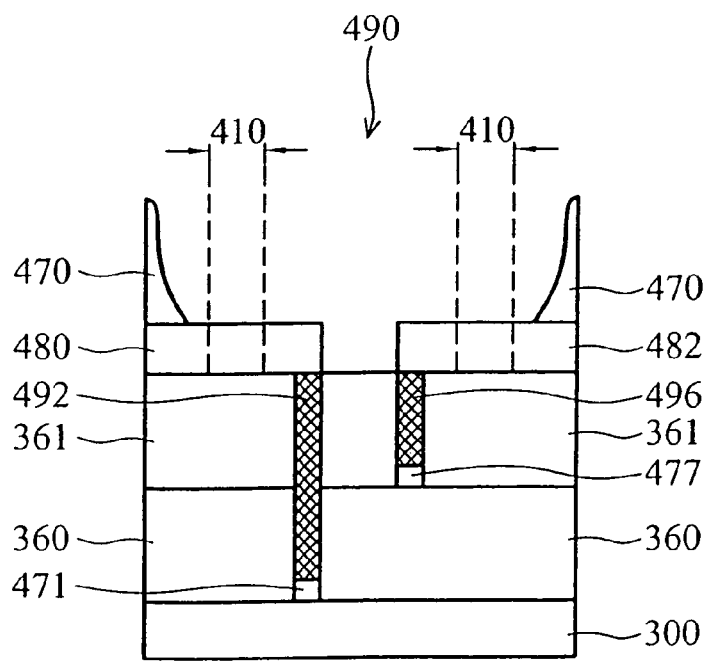

The second embodiment of the present invention is depicted in FIG. 4A, FIG. 4B, FIG. 4C and FIG. 4D. FIG. 4A is a top view of the fuse structure of the present invention. FIGS. 4B, 4C and 4D are sectional views of FIG. 4A. FIG. 4B shows a cross section of the third horizontal line H3 of FIG. 4A. FIG. 4C shows a cross section of the second horizontal line H2 of FIG. 4A. FIG. 4D shows a cross section of the third vertical line V3 of FIG. 4A.

In the second embodiment, the first horizontal line H1, the second horizontal line H2, the third horizontal line H3 and the fourth horizontal line H4 are arranged in order. The first vertical line V1, the second vertical line V2, the third vertical line V3, the fourth vertical line V4 the fifth vertical line V5, the sixth vertical line V6 and the seventh vertical line V7 are arranged in order.

In FIG. 4B shows a substrate 400. In FIG. 4A an eleventh conductive layer 471 (dotted line) is formed on part of the substrate 400, wherein a layout of the eleventh conductive layer 471 starts from a fourth horizontal line H4 along a first vertical line V1 and extends to a second horizontal line H2 along a second horizontal line H2, turning in a third vertical line V3. A twelfth conductive layer 472 (dotted line) is formed on part of the substrate 400. The twelfth conductive layer 472 starts from a fourth horizontal line H4 along a seventh vertical line V7 and extends to the second horizontal line H2 along the second horizontal line H2, turning in a fifth vertical line V5. A thirteenth conductive layer (dotted line) is formed on part of the substrate 400. The thirteenth conductive layer 473 starts from the second vertical line V2 along a third horizontal line H3 and extends near to a fourth vertical line V4 along the fourth vertical line V4, turning in a first horizontal line H1. A fourteenth conductive layer 474 (dotted line) is formed on part of the substrate 400. The fourteenth conductive layer 474 starts from a sixth vertical line V6 along the third horizontal line H3 and extends to the fourth vertical line V4 along the fourth vertical line V4, turning in the first horizontal line H1. The eleventh conductive layer 471, the twelfth conductive layer 472, the thirteenth conductive layer 473, the fourteenth conductive layer 474 are tungsten or polysilicon. The first dielectric layer 360 is formed on the substrate 400, the eleventh conductive layer 471, the twelfth conductive layer 472, the thirteenth conductive layer 473 and the fourteenth conductive layer 474. The first dielectric layer 360 is $SiO_2$.

In FIG. 4A a fifteenth conductive layer 475, a sixteenth conductive layer 476, a seventeenth conductive layer 477 and an eighteenth conductive layer 478 are formed on part of the dielectric layer 360. The fifteenth conductive layer 475 (dotted line) starts from the first vertical line V1 along the second horizontal line H2 and extends to the second vertical line V2. The sixteenth conductive layer 476 (dotted line) starts from the seventh vertical line V7 along the second horizontal line H2 and extends to the sixth vertical line V6. The seventeenth conductive layer 477 (dotted line) starts from the third vertical line V3 along the third horizontal line H3 and extends to near the fourth vertical line V4 along the fourth vertical line V4, turning in the first horizontal line H1. The eighteenth conductive layer 478 (dotted line) starts from the fifth vertical line V5 along the third horizontal line H3 and extends near to the fourth vertical line V4 along the fourth vertical line V4, turning in the first horizontal line H1. The fifteenth conductive layer 475, the sixteenth conductive layer 476, the seventeenth conductive layer 477 and the eighteenth conductive layer are tungsten or polysilicon. The first dielectric layer 360, the fifteenth conductive layer 475, the sixteenth conductive layer 476, the seventeenth conductive layer 477 and the eighteenth conductive layer are formed on a second dielectric layer 361. The second dielectric layer is SiO.sub.2. FIG. 4B, FIG. 4C and FIG. 4D show a plurality of openings formed on the dielectric layer 361 to expose the eleventh conductive layer 371, the twelfth conductive layer 372, the thirteenth conductive layer 373, the fourteenth conductive layer 374, the fifteenth conductive layer 375, the sixteenth conductive layer 376, the seventeenth conductive layer 377 and the eighteenth conductive layer near the laser spot 410 into a eleventh conductive plug 491, a twelfth conductive plug 492, a thirteenth conductive plug 493, a fourteenth conductive plug 494, a fifteenth conductive plug 495, a sixteenth conductive plug 496, a seventeenth conductive plug 497 and an eighteenth conductive plug 498. The eleventh conductive plug 491, the twelfth conductive plug 492, the thirteenth conductive plug 493, the fourteenth conductive plug 494, the fifteenth conductive plug 495, the sixteenth conductive plug 496, the seventeenth conductive plug 497 and the eighteenth conductive plug 498 are tungsten or polysilicon.

In FIG. 4A a ninth conductive layer 479, a twentieth conductive layer 480, a twenty first conductive layer 481, a twenty second conductive layer 482, a twenty third conductive layer 483, a twenty fourth conductive layer 484, a twenty fifth conductive layer 485, a twenty sixth conductive layer 486, a twenty seventh conductive layer 487 and a twenty eighth conductive layer 488 are formed on part of the second dielectric layer 361. The nineteenth conductive layer 479 starts from the first horizontal line H1 along the second vertical line V2 in the fourth direction D and extends to the second horizontal line H2. The twentieth conductive layer 480 starts from the first horizontal line H1 along the third vertical line V3 and extends to the second horizontal line H2. The twenty first conductive layer 481 starts from the fourth horizontal line H4 along the second vertical line V2 and extends to the third horizontal line H3. The twenty second conductive layer 482 starts from the fourth horizontal line H4 along the third vertical line V3 and extends to the third horizontal line H3. The twenty third conductive layer 483 starts from the first horizontal line H1 along the fourth vertical line V4 and extends to the fourth horizontal line H4. The twenty fourth conductive layer 484 starts from the fourth horizontal line H4 along the fifth vertical line V5 and extends to the third horizontal line H3. The twenty fifth conductive layer 485 starts from the fourth horizontal line H4 along the sixth vertical line V6 and extends to the third horizontal line H3. The twenty sixth conductive layer 486 starts from the first horizontal line H1 along the fifth vertical line V5 and extends to the second horizontal line H2. The twenty seventh conductive layer 487 starts from the first horizontal line H1 along the sixth vertical line V6 and extends to the second horizontal line H2. The twenty eighth conductive layer 488 starts from the first horizontal line H1 along the seventh vertical line V7 and extends to the fourth horizontal line H4. The eleventh conductive plug 491 is electrically connected to the fifteenth conductive layer 475 and the nineteenth conductive layer 479 is a fuse unit. The twelfth conductive plug 492 is electrically connected to the eleventh conductive layer 471 and twentieth conductive layer 480 is a fuse unit. The thirteenth conductive plug 493 is electrically connected to the twelfth conductive layer 472 and the twenty sixth conductive layer 486 is a fuse unit. The fourteenth conductive plug 494 is electrically connected to the sixteenth conductive layer 476 and twenty seventh conductive layer 487 is a fuse unit. The fifteenth conductive plug 495 is electrically connected to the thirteenth conductive layer 473 and the twenty first conductive layer 481 is a fuse unit. The sixteenth conductive plug 496 is electrically connected to the seventeenth conductive layer 477 and twenty second conductive layer 482 is a fuse unit. The seventeenth conductive plug 497 is electrically connected to the eighteenth conductive layer 478 and twenty fourth conductive layer 484 is a fuse unit. The eighteenth conductive plug 498 is electrically connected to the fourteenth conductive layer 474 and the twenty fifth conductive layer 485 is a fuse unit. The twenty third conductive layer is a fuse unit. The twenty eight conductive is a fuse unit. The passivation layer is PE-TEOS $SiO_2$ or $Si_3N_4$.

FIG. 4A shows a fuse window 490 with a plurality of fuse structures (FIG. 4A only shows one fuse structure). Each fuse structure comprises ten fuse units, fuse unit 421, fuse unit, 422, fuse unit 423, fuse unit 424, fuse unit 425, fuse unit 426, fuse unit 427, fuse unit 428, fuse unit 429 and fuse unit 430. Each fuse unit has its own laser spot 410. Fuse units 421, 422, 423, 424, 425, 426, 427, 428, 429 and 430 are not electrically connected to each other. An eleventh laser spot is formed on the nineteenth conductive layer 479. A twelfth laser spot is formed on the twentieth conductive layer 480. A thirteenth laser spot is formed on the twenty first conductive layer 481. A fourteenth laser spot is formed on the twentieth second conductive layer 482. A fifteenth laser spot is formed on the twenty third conductive layer 483. A sixteenth laser spot is formed on the twenty fourth conductive layer 484. The seventeenth laser spot is formed on the twenty fifth conductive layer 485. The eighteenth laser spot is formed on the twenty sixth conductive layer 486. The nineteenth laser spot is formed on twenty seventh conductive layer 487. The twentieth laser spot is formed on twenty eighth conductive layer 488.

Figure 4E:
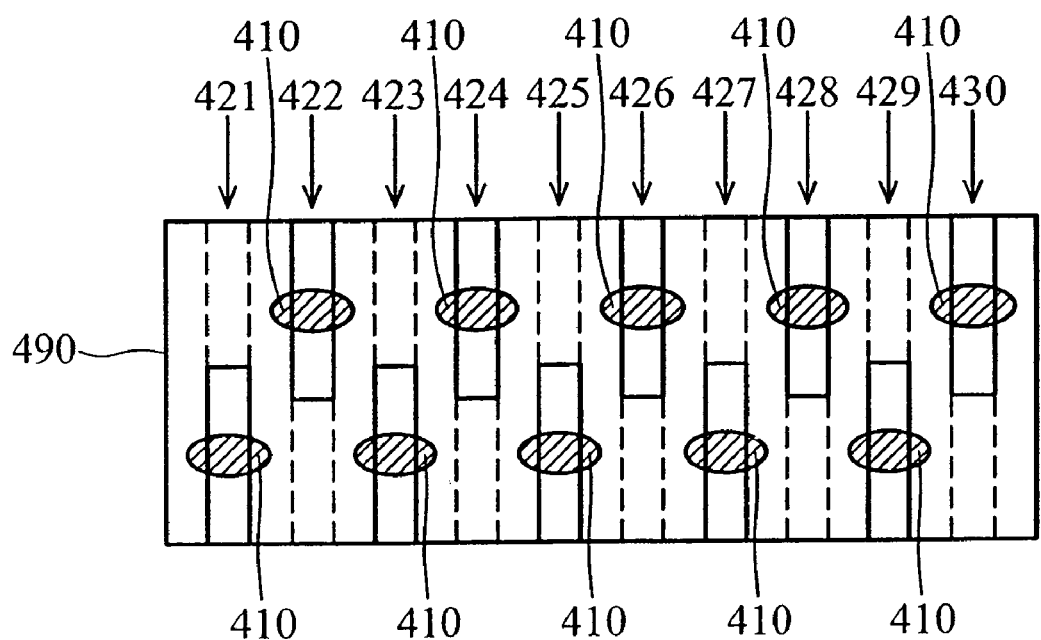

In FIG. 4A, FIG. 4B and FIG. 4B, laser beam 290 blows the laser spot 410 (the thirteenth laser spot) in the fuse unit 425 of the twenty first conductive layer 481. Misalignment of the laser beam 290 or thermal shock from the laser blow process can damage part of the eleventh conductive layer 471 adjacent to the fuse unit 422. FIG. 4E shows a traditional fuse structure in the same fuse area comprising ten fuse units. The distance between fuse units of the second embodiment is more than the prior art, thus receiving less damage from the laser blow process. In the second embodiment of the present invention the distance between the thirteenth laser spot 410 and adjacent to the eleventh conductive layer 471 is 1.66 times that in the prior art.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A fuse structure with a fuse window wherein a thickness-wise direction is perpendicular to the fuse window, comprising:
   a first fuse unit, comprising a first portion and a second portion coplanar therewith;
   a second fuse unit, comprising a third portion and a fourth portion non-coplanar therewith, wherein the third portion overlaps the first portion essentially in the thickness-wise direction, and the third portion connects the fourth portion through a first plug;
   a third fuse unit, comprising a fifth portion and a sixth portion coplanar therewith; and
   a fourth fuse unit, comprising a seventh portion and a eighth portion non-coplanar therewith, wherein the eighth portion overlaps the sixth portion essentially in the thickness-wise direction, and the eighth portion connects the seventh portion through a second plug;
   wherein the fourth portion and the seventh portion are arranged between the first fuse unit and the third fuse unit wherein the first, fifth and seventh portions are coplanar with each other.

2. The fused structure as claimed in claim 1, wherein the fourth portion is aligned with the second portion along their lenghtwise directions.

3. The fused structure as claimed in claim 1, wherein the first portion is aligned with the second portion along their lengthwise directions.

4. The fused structure as claimed in claim 1, wherein the fifth portion is aligned with the sixth portion along their lengthwise directions.

5. The fuse structure as claimed in claim 4, further comprising: a first laser spot in the second portion.

6. The fuse structure as claimed in claim 5, further comprising: a second laser spot in the fourth portion.

7. The fuse structure as claimed in claim 6, further comprising: a third laser spot in the seventh portion.

8. The fuse structure as claimed in claim 7, further comprising: a fourth laser spot in the fifth portion.

9. The fuse structure as claimed in claim 8, wherein the first, second, and third portions are aligned in a first line along their lengthwise directions.

10. The fuse structure as claimed in claim 9, wherein the fourth and seventh portions are aligned in a second line along their lengthwise directions, wherein the second line is parallel to the first line.

11. The fused structure as claimed in claim 10, wherein the fifth, sixth and eighth portions aligned in third line along their lengthwise directions, wherein the third line is parallel to the second line.

\* \* \* \* \*